(12) United States Patent
Williamson et al.

(10) Patent No.: US 11,081,406 B2
(45) Date of Patent: Aug. 3, 2021

(54) VIA INTEGRITY AND BOARD LEVEL RELIABILITY TESTING

(71) Applicant: Texas Instruments Incorporated, Dallas, TX (US)

(72) Inventors: Jaimal Mallory Williamson, McKinney, TX (US); Ethan Tilden Davis, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 297 days.

(21) Appl. No.: 16/015,965

(22) Filed: Jun. 22, 2018

(65) Prior Publication Data
US 2019/0393106 A1    Dec. 26, 2019

(51) Int. Cl.
*H01L 21/66*    (2006.01)
*H01L 21/48*    (2006.01)
(Continued)

(52) U.S. Cl.
CPC .......... *H01L 22/14* (2013.01); *G01R 31/2817* (2013.01); *G01R 31/2874* (2013.01);
(Continued)

(58) Field of Classification Search
CPC ... H05K 3/00; H05K 1/00; H05K 1/02; G01R 27/00; G01R 27/26; G01R 31/00;
(Continued)

(56) References Cited

U.S. PATENT DOCUMENTS 4,648,212 A  *  3/1987  Dawson ................. B24B 49/02
                                                     451/1
2002/0081772 A1    6/2002  Madrid et al.
(Continued)

FOREIGN PATENT DOCUMENTS

| JP | 2017-135128 | * | 8/2017 |
| KR | 10-2000-0045926 | * | 7/2000 |
| KR | 2017-135128 | * | 8/2017 |

OTHER PUBLICATIONS

"IPC-TM-650 Test Methods Manual", IPC Association Connecting Electronics Industries, 2.6.25, DC Current Induced Thermal Cycling Test, May 2001, Test Methods Subcommittee (7-11), 3 pages.
(Continued)

*Primary Examiner* — Carl J Arbes
(74) *Attorney, Agent, or Firm* — Ronald O. Neerings; Charles A. Brill; Frank D. Cimino

(57) ABSTRACT

Described examples provide a method to evaluate reliability of ball grid array products in which an interconnect stress test is performed that passes current through outer layer micro-vias of a test coupon portion of a production panel that is soldered to a printed circuit board, and the reliability of ball grid array products manufactured using package substrate portions of the production panel is evaluated according to the results of the interconnect stress test. A test coupon includes a rigid core material layer, dielectric layers laminated between copper layers above and below the core material layer, conductive micro-vias that extend through at least one of the dielectric layers between two of the copper layers, and conductive land pads on an outer one of the dielectric layers, the conductive land pads individually contacting one of the micro-vias.

23 Claims, 6 Drawing Sheets

(51) Int. Cl.
*G01R 31/28* (2006.01)
*H01L 23/498* (2006.01)

(52) U.S. Cl.
CPC ........ *H01L 21/486* (2013.01); *H01L 21/4853* (2013.01); *H01L 21/4857* (2013.01); *H01L 22/30* (2013.01); *H01L 23/49816* (2013.01); *H01L 23/49827* (2013.01)

(58) Field of Classification Search
CPC .. G01R 31/01; G01R 31/281; G01R 31/2812; G01R 31/2874; G01R 31/2817; H01L 21/4853; H01L 21/4857; H01L 21/486; H01L 22/14; H01L 22/30; H01L 23/49816; H01L 23/49827
See application file for complete search history.

(56) References Cited

U.S. PATENT DOCUMENTS

| | | | |
|---|---|---|---|
| 2003/0205799 A1 | 11/2003 | Yunus | |
| 2006/0033210 A1 | 2/2006 | Chauhan et al. | |
| 2012/0217987 A1* | 8/2012 | Kuczynski | G01R 31/2817 324/756.01 |

OTHER PUBLICATIONS

"Flip Chip Ball Grid Array Package Reference Guide", Literature No. SPRU811A, May 2005, Texas Instruments, 72 pages.

* cited by examiner

VIA INTEGRITY AND BOARD LEVEL RELIABILITY TESTING

BACKGROUND

Flip chip technology allows a semiconductor die or IC chip to be electrically connected to a package substrate, such as a printed circuit board (PCB), sometimes referred to as a chip carrier or substrate. Flip chip microelectronic assembly involves direct electrical connection of face-down (or flipped) integrated circuit (IC) chips onto the package substrate using conductive bumps on the chip bond pads. Flip chip ball grid array (BGA) packages provide the design flexibility to incorporate higher signal density and overall IC functionality into a small footprint. Flip chip BGA packages can be mounted using standard printed circuit board assembly techniques. The package substrate typically includes micro-vias that interconnect connect layers for signal routing between the die and a host circuit. Micro-via cracking can be caused by thereto-mechanical stresses during temperature excursions from lead (Pb) free reflow from soldered connections during device operation and/or by thermal fluctuations in field conditions. Cracking or other compromise of the micro-vias can lead to loss of signal integrity and reduced device performance. Testing micro-via reliability by cross sectioning techniques during failure analysis is costly and labor intensive. Interconnect stress testing (IST) can be used to screen products for micro-via cracking. The interconnect stress test is a test that measures any changes in resistance of the micro-via by passing DC current through the micro-via of interest, which in turn creates a temperature cycle range for reliability assessment. One example of IST testing is described in the IPC-TM-650 specification by IPC, the association connecting electronics industries. However, the IST test operates at the substrate level and can fail to identify micro-via susceptibility to thermal stresses encountered in field use of a flip chip BGA.

SUMMARY

Described examples provide a method, including performing an interconnect stress test of dedicated test coupons designed into and extracted from a test coupon extracted from a production panel that is soldered to a printed circuit board, and evaluating reliability of the ball grid array products manufactured using package substrate portions of the production panel according to the results of the interconnect stress test. Example implementations include evaluating micro-via reliability, solder joint reliability, and/or solder ball metallurgies of the BGA products according to results of the interconnect stress testing. In one example, multiple test coupon portions are separated from the production panel and attached to associated printed circuit boards using different attachment processes, and the IST test results are used to evaluate the second level interconnect reliability performance. In one example, the interconnect stress test includes passing current through outer layer micro-vias of a test coupon portion extracted from a production panel that is soldered to a printed circuit board. Described method examples mitigate or avoid the inherent deficiency of the IST concept by incorporating the device to board coupling using an attached PCB to improve detection of device susceptibilities in actual customer applications. Further described examples provide a test coupon that includes a rigid core material layer, dielectric layers laminated between copper layers above and below the core material layer, conductive micro-vias that extend through at least one of the dielectric layers between two of the copper layers, and conductive land pads on an outer one of the dielectric layers. The conductive land pads individually contact one of the micro-vias to facilitate soldering to a PCB.

DETAILED DESCRIPTION

Figure 1:
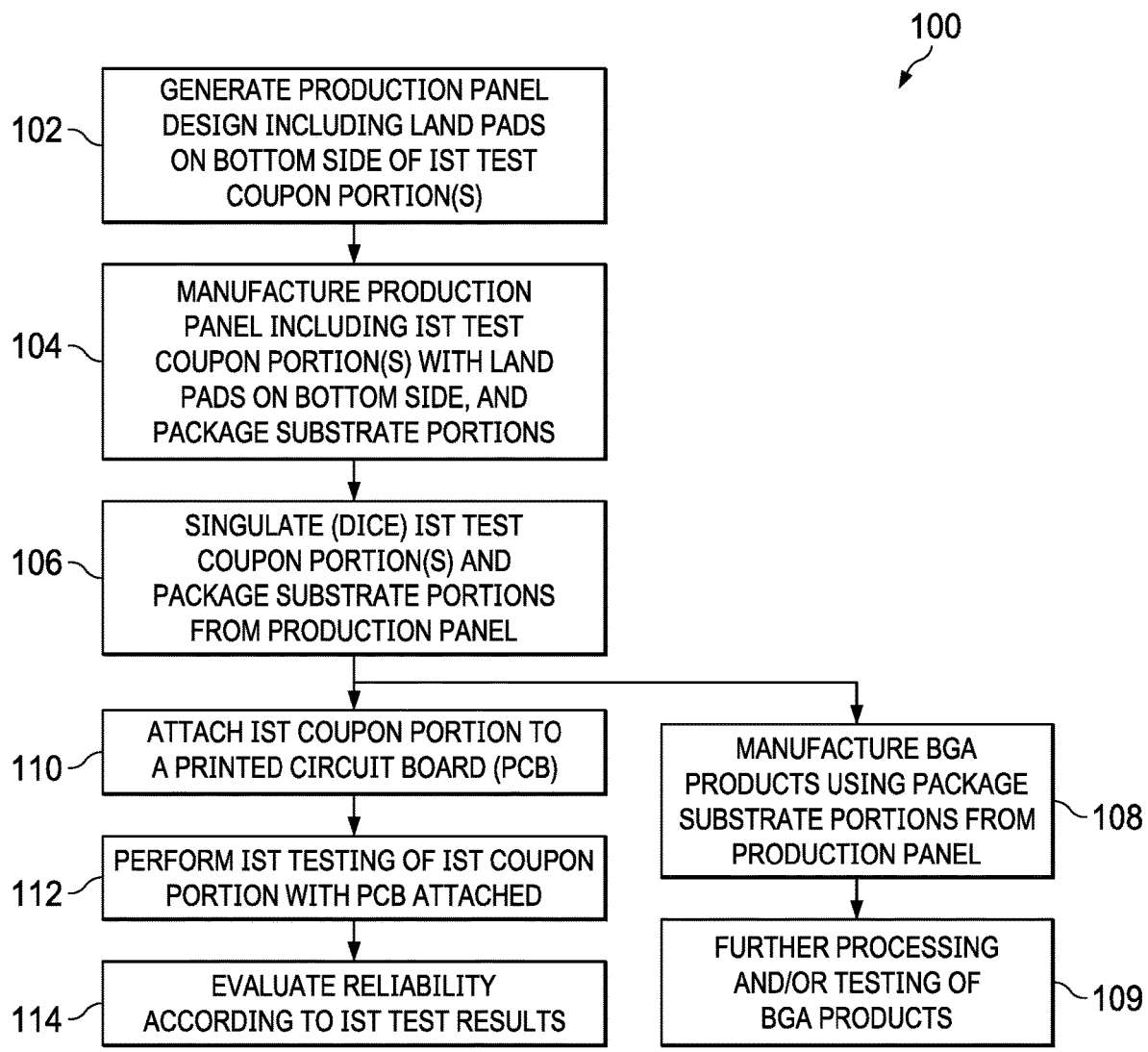
FIG. 1 is a flow diagram of a method of evaluating reliability of BGA products according to one or more aspects of the present disclosure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a method 100 for evaluating reliability of BGA products according to one or more aspects of the present disclosure. The example method 100 includes generating a production panel design at 102. The design includes land pads on a bottom side of one or more IST test coupon portions of the production panel for BGA attach processing and eventual SMT attachment to a PCB. One example implementation includes providing a substrate design file to an IST testing vendor that creates an IST test coupon design file for incorporation into a production panel design.

The method 100 also includes manufacturing a production panel and 104 that includes the IST test coupon portion with land pads on the bottom side, as well as package substrate portions. In one implementation, the package substrate portions of the production panel are designed at 102 and manufactured at 104 according to a final flip chip BGA product design destined for ultimate soldering to a host circuit, such as a printed circuit board in a customer system. In this example, the test coupon portion is exposed to the same or substantially similar manufacturing processes and conditions as the production panel design.

At 106, the method 100 further includes separating (e.g., singulating, dicing) the IST test coupon portion and the package substrate portions from the production panel. Any suitable die singulation (e.g., dicing) process can be used at 106 to separate the package substrate and IST test coupon portions from the manufactured production panel, such as sawing, etching, laser cutting or combinations thereof. The illustrated method 100 in FIG. 1 also includes manufacturing ball grid array BGA products at 108 using the package substrate portions separated from the production panel at 106, as well as performing further processing and/or testing of the BGA products at 109.

The method 100 further includes attaching a printed circuit board to the test coupon portion at 110. Any suitable process can be used at 110 to attach a printed circuit board to the test coupon portion. In one example, a surface mount (SMT) process is performed at 110, which solders one or more land pads of the test coupon portion to conductive features (e.g., land pads) of the printed circuit board, for example, using BGA solder balls. The surface mount process at 110 in one example is the same or similar to a surface mount process used to solder singulated semiconductor dies to the package substrate portions of the production panel in manufacturing the ball grid array BGA products at 108.

The method 100 also includes testing the test coupon portion and the attached printed circuit board at 112. The interconnect stress test at 112 in one example passes current through outer layer micro-vias of the test coupon portion. In one example, the testing at 112 uses techniques and systems compatible with the IST IPC-TM-650 specification, with the addition of the PCB soldered to the IST coupon portion. The attached PCB is electrically compatible with the IPC IST resistance heated testing, and soldering of the PCB to the test coupon portion causes current to flow through outer layer micro-vias of the test coupon portion. In this manner, the IST testing at 112 stresses outer layer micro-vias to identify potential cracking susceptibility that may not be detectable using IST testing with no attached PCB. As used herein, micro-vias include any conductive via of any size or shape, including plated-through hole barrels that extend at least partially in the test coupon portion and/or at least partially in the attached PCB. In one implementation, the test system programming and/or hardware is modified to perform IST as generally outlined in the IPC-TM-650 standard, with the PCB attached to the test coupon portion to evaluate micro-via reliability and/or solder joint reliability. IPC-TM-650 testing in one implementation measures changes in resistance of micro-vias and measures changes in resistance of the resistance of internal layer connections as micro-vias are subjected to thermal cycling.

The method 100 in one example includes evaluating reliability at 114 of the BGA products manufactured using package substrate portions at 108, according to (e.g., based at least partially on or in response to) the results of the interconnect stress testing. In one example, the reliability evaluation at 114 includes evaluating 114 solder joint reliability of the BGA products according to the results of the interconnect stress test (IST). In one implementation, the evaluation of the solder joint reliability at 114 includes evaluating impact of BGA ball solder metallurgy according to the results of the interconnect stress test IST. In one example, the reliability evaluation at 114 includes evaluating 114 micro-via reliability of the BGA products according to the results of the interconnect stress test IST.

Figure 2:
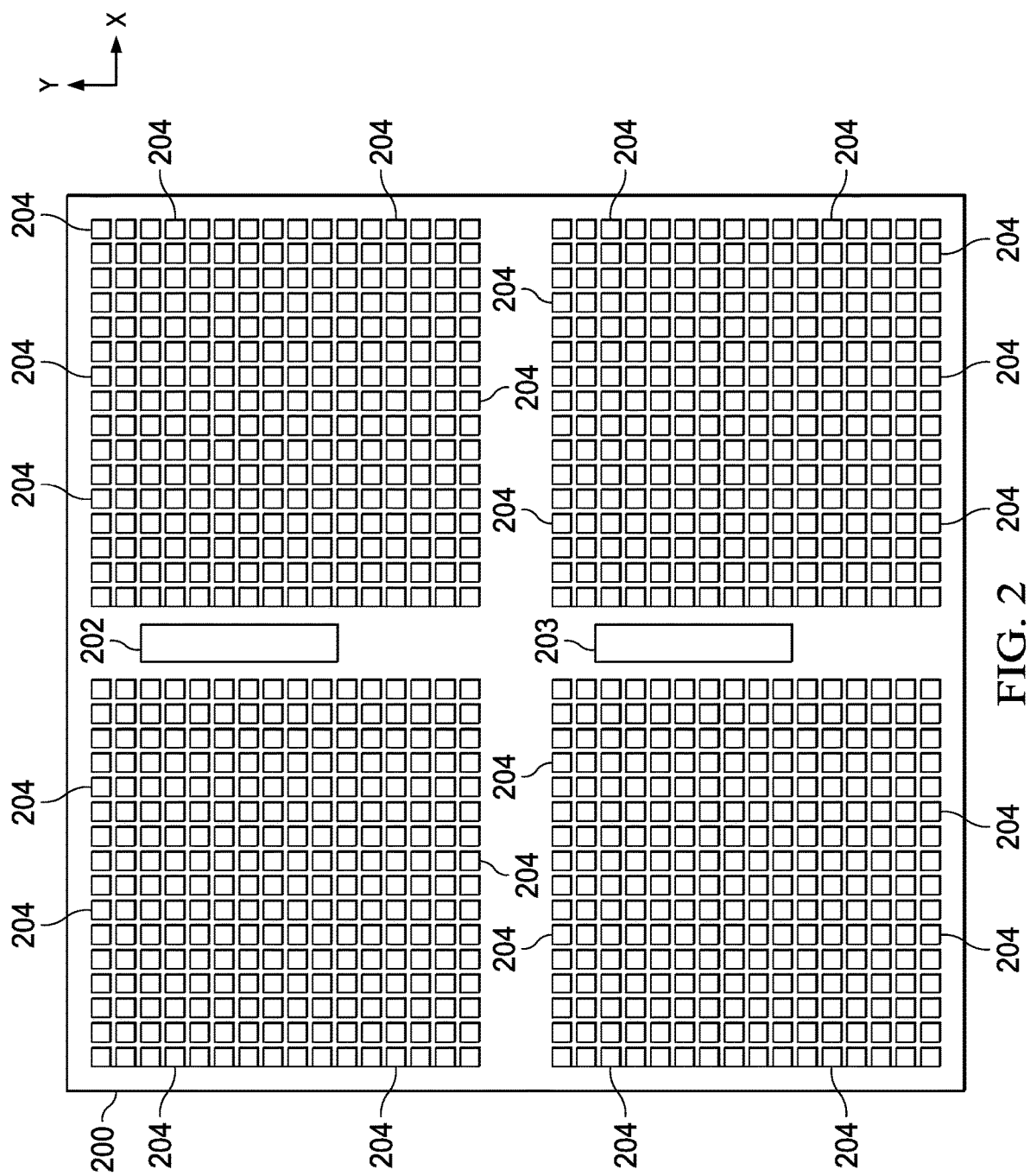
FIG. 2 is a top plan view of an example production panel with package substrate portions and test coupon portions.
Figure 3:
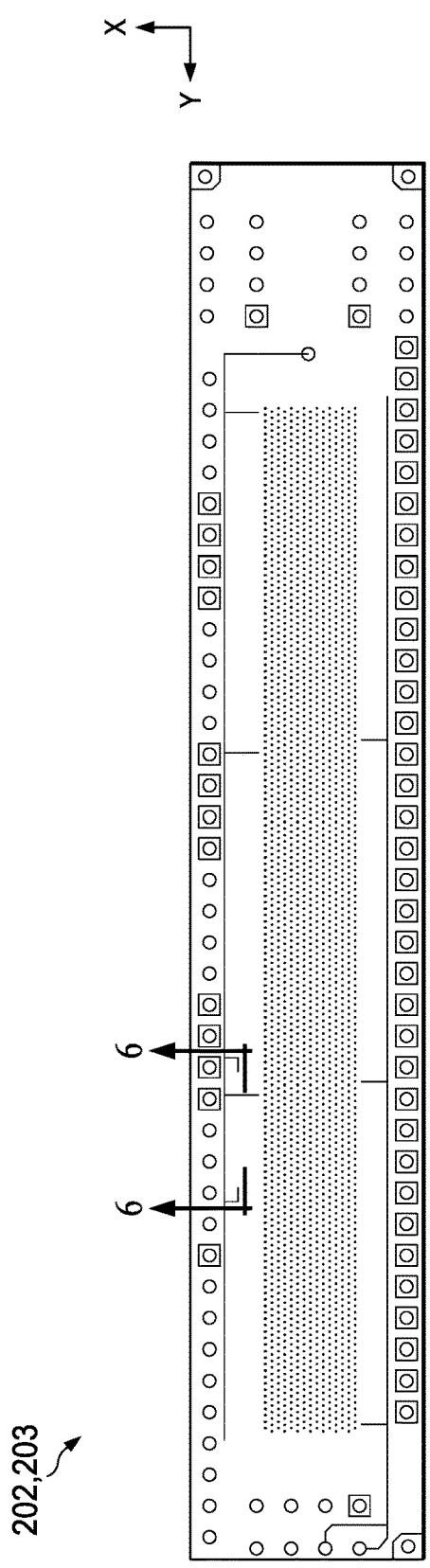
FIG. 3 is a top plan view of an example test coupon portion of the production panel in FIG. 2.

Referring also to FIGS. 2-6, FIG. 2 shows an example production panel 200 that includes first and second test coupon portions 202 and 203, respectively, as well as package substrate portions 204. FIG. 3 is a top of an example test coupon portion 202, 203 of the production panel in FIG. 2, The example production panel 200 is generally rectangular, and the example test coupon portions 202, 203 are positioned inward of four arrays of package substrate portions 204, but not limited to this location. Other production panel shapes and configurations are possible. In various implementations, the production panel 200 includes one or more test coupon portions.

FIG. 3 shows a detailed top view of an example test coupon portion 202, 203 removed from the production panel 200 (e.g., at 106 in FIG. 1). The top side of the example test coupon portion 202, 203 includes a number of conductive vias, and the test coupon portion 202, 203 includes the conductive routing features, such as inner and/or outer layer traces form of copper, aluminum or other conductive material. In one example, the production panel 200 is fabricated from a printed circuit hoard material, such as polyimide, glass-reinforced epoxy laminate material (e.g., flame retardant FR-4 material compliant with the UL94V-0 standard) or substrate build-up technology with Ajinomoto build-up film (ABF) dielectric layers laminated between copper layers above and below a rigid core material. The production panel 200 can be a single layer structure or a multi-layer substrate as illustrated and described further below in connection with the example of the FIG. 6. The production panel 200 can include plated through holes and/or micro-vias, some or all of which provide electrical interconnection between dielectric layers of a multi-layer structure. The production panel 200 in certain examples also includes traces or conductive routing features on a top side, a bottom side, and/or within or between internal layers.

Figure 4:
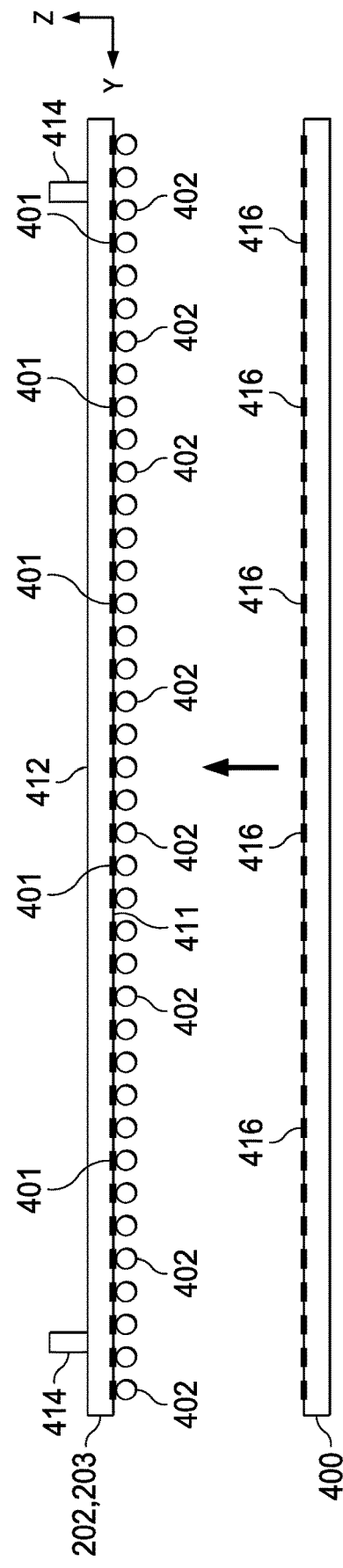
FIG. 4 is a side elevation view showing attachment of a printed circuit board to the test coupon portion of FIG. 3.
Figure 5:
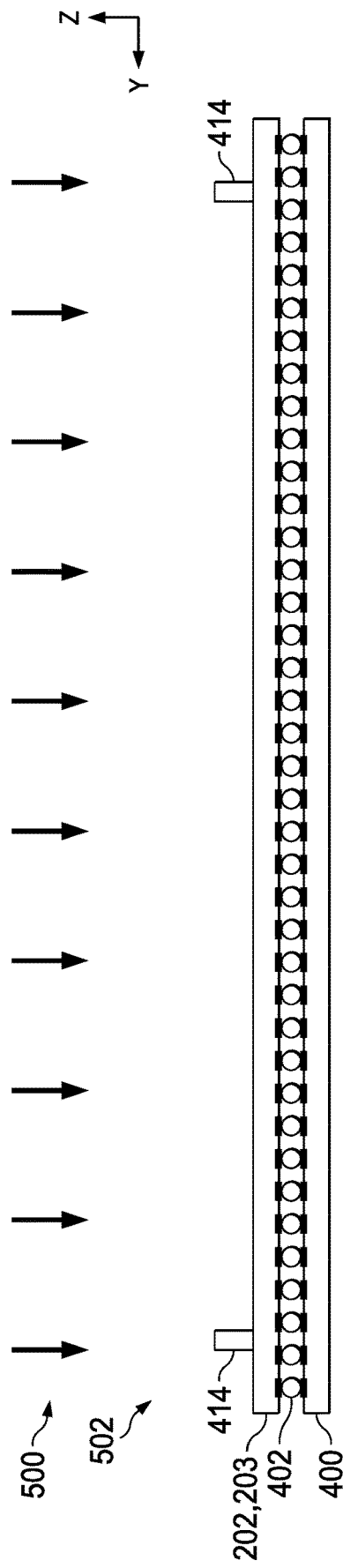
FIG. 5 is a side elevation view showing the printed circuit board attached to the test coupon portion.

FIGS. 4 and 5 show an example surface mount technology (SMT) attachment process 500 (FIG. 5), which attaches a printed circuit board 400 to the test coupon portion 202, 203. The test coupon portion 202, 203 includes conductive land pads 401 and solder halls 402 on a first (e.g., bottom) side 411. In one example, the opposite second (e.g., top) side 412 includes connectors 414 that provide electrical interconnectivity for IST testing system equipment (not shown). In addition, the example PCB 400 includes land pads 416 on the upper side for soldering to the test coupon portion 202, 203. The attachment process in one example is an SMT process that joins portions of an upper side of the PCB 400 to the first side 411 of the test coupon portion 202, 203. In this example, the process 500 creates solder connections through reflowing of the solder balls 402 that electrically connect the conductive land pads 401 on the first side 411 of the test coupon portion 202, 203 to the land pads 416 of the PCB 400. The SMT process 500 provides a test assembly 502 that includes the printed circuit board 400 attached to the test coupon portion 202, 203 as shown in FIG. 5.

Figure 6:
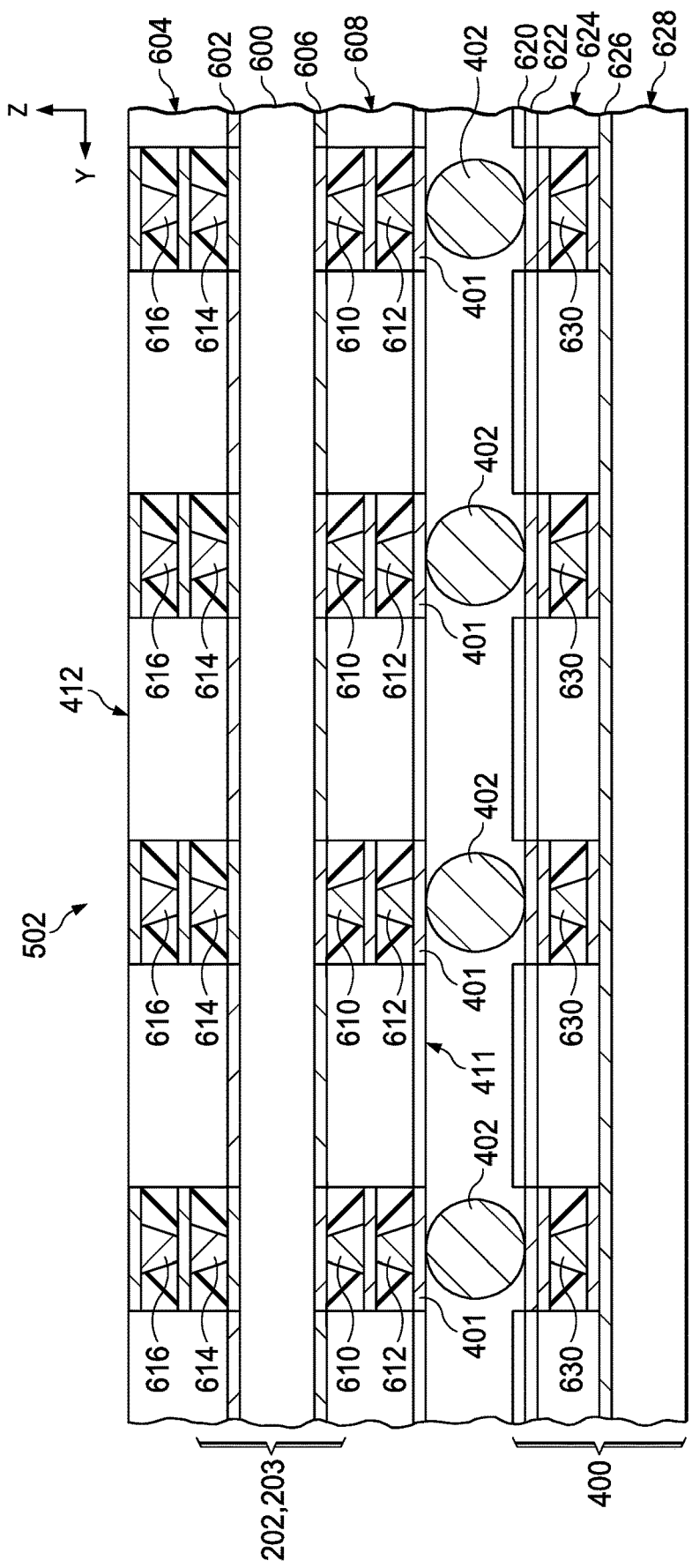
FIG. 6 is a partial sectional side view showing a portion of the test coupon portion and the attached printed circuit board.

FIG. 6 shows a partial sectional view of a portion of the test assembly 502 with the test coupon portion 202, 203 and the attached printed circuit, board 400 taken along line 6-6 of FIG. 3. The example test coupon portion 202, 203 in FIG. 6 is a multi-layer structure that includes a core material 600, one or more conductive traces or features 602 above the core material layer 600, and a first outer (e.g., upper) layer 604 (e.g., FR-4 or ABF buildup/copper layer) that extends to the top side 412. The test coupon portion 202, 203 in FIG. 6 also includes further conductive traces or features 606 below the core material layer 600, and a lower layer 608 that extends to the bottom side 411, The lower layer 608 can be a single or multi-layer structure. The example layer 608 in FIG. 6 includes inner micro-vias 610 connected to the conductive features 606, and outer micro-vias 612 with bottom surfaces that extend to the bottom side 411 of the test coupon portion 202, 203. The upper layer 604 can also be a single or multi-layer structure with internal conductive trace layers or structures and conductive micro-vias writing electrical connection there between. The example layer 604 in FIG. 6 includes inner micro-vias 614 connected to the conductive features 602, and outer micro-vias 616 with top surfaces that extend to the top side 412 of the test coupon portion 202, 203.

The example PCB 400 in FIG. 6 is a multi-layer structure, although single-layer PCBs can be used in other implementations. The PCB 400 includes an upper or top layer 620 (e.g., FR-4) disposed above a first conductive trace or feature layer 622. A middle layer 624 extends between the conductive feature layer 622 and a lower conductive feature layer 626. A bottom PCB layer 628 covers the conductive layer 626 to form a bottom side of the PCB 400. The example PCB 400 also includes conductive micro-vias 630 that connect the conductive features 622 and 626.

As shown in FIG. 6, the attachment process creates a soldered, electrically conductive, connection of the outer micro-vias 612 at the bottom side 411 of the test coupon portion 202, 203 to exposed conductive features 622 of the PCB. IST testing of a coupon without an attached PCB is sensitive to vias 610 and 614 at substrate inner layers. The coefficient of thermal expansion (CTE) mismatch at the interface with the core material 600 creates stress. However, empirical testing shows vias 612 and 616 at the outer layers 604 and 608 are not as sensitive during IST testing with no attached PCB because similar interactions and CTE mismatch with the core material 600 does not exist. In the illustrated example of FIG. 6, when the PCB 400 is attached to the IST test coupon 202, 203, the impact of thermal cycling will have a greater impact on the outer layer (e.g., coupon bottom layer 608 and outer vias 612) because of CTE mismatch.

Attaching the IST coupon portion 202, 203 to the PCB 400 (e.g., at 110 in FIG. 1) allows micro-vias 612 at substrate outer layers to be stressed commensurate with end use application conditions of the manufactured BGA products. The IST test results for testing with the attached PCB 400 indicate the reliability of the outer micro-vias 612 to better assess the corresponding micro-via reliability of the manufactured BGA products because the IST coupon testing with the PCB 400 attached better simulates the field use conditions of the produced BGA products built with the substrates 204 and soldered to an end user's host circuit board (not shown). In one example, a second PCB (e.g., FIGS. 7 and 8 below) is attached (e.g., soldered using flip chip attachment processing) to the upper outer micro-vias 616 at the top side 412 of the test coupon portion 202, 203. The connectors 414 can be mounted to the further attached PCB (or to the PCB 400) to allow interconnection of IST testing equipment (not shown) for IST testing to also provide thermal stress at 112 to the upper outer micro-vias 616 in FIG. 1.

Described examples mitigate or avoid the inherent deficiency of the IST concept by incorporating the device to board coupling via a PCB attachment SMT process, which simulates customer applications. The IST testing in one example (e.g., at 112 in FIG. 1 above) includes connecting signal generating equipment (not shown) to the test coupon portion and/or connectors mounted to the test coupon portion. One example uses daisy chain testing to measure the change in resistance between stacked vias using the processed IST coupon portion assembly 502 by applying current to induce temperature cycling. The test equipment in one example applies electrical signals to cause thermal cycling by applying a current through a specific coupon configuration. In one example, the test equipment applies DC current through the internal layer connection for resistance heating of the conductive features and micro-vias of the test coupon portion 202, 203 to bring the temperature of the copper via and trace features to a designated temperature. The test equipment switches the current on and off to create thermal cycles between room temperature and the designated temperature within the sample. The thermal cycling induces cyclic fatigue strain in the plated-through hole barrels of the micro-vias and internal layer interconnects, and accelerates any latent defects. The number of cycles achieved permits a quantitative assessment of the performance of the entire interconnect and hence allows evaluation of the reliability of the manufactured BGA products, including solder joint reliability, ball solder metallurgy reliability, and/or micro-via reliability of the BGA products (e.g., at 114 in FIG. 1).

In some implementations, multiple test coupon portions are provided in the production panel 200 (e.g., a first test coupon portion 202 and a second test coupon portion 203 in FIG. 2), and the process 100 in FIG. 1 is used to concurrently evaluate different BGA ball solder metallurgies simulating a board level environment. In one example, the individual test coupon portions 202 and 203 each include land pads (e.g., 401 in FIGS. 4-6), and the test coupon portions 202 and 203 are separated from the production panel 200 at 106 in FIG. 1. A first printed circuit board 400 is attached at 110 to the first test coupon portion 202 using a first surface mount process 500 to solder land pads 401 of the first test coupon portion 202 to conductive features 630 of the first printed circuit board 400. In addition, the first surface mount process 500 uses a first ball solder metallurgy to solder the land pads 401 of the first test coupon portion 202 to the conductive features 630 of the first printed circuit board 400. In this example, a second printed circuit board 400 is attached at 110 to the second test coupon portion 203 using a second surface mount process 500, in which the second surface mount process 500 uses a different second ball solder metallurgy to solder the land pads 401 of the second test coupon portion 203 to the conductive features 630 of the second printed circuit board 400. Each of the test coupon portions 202 and 203 is individually IST tested at 112, and the results of the two IST tests are analyzed at 114 to evaluate the first and second ball solder metallurgies according to results of the interconnect stress test. In this example, the process 100 includes evaluation of multiple BGA ball solder metallurgies to enhance the data gained from IST testing. This example can be used to evaluate different BGA ball metallurgies for quick assessment for solder joint reliability. One benefit is accelerating availability of results with coupon-based testing as opposed to running board level tests.

In another possible implementation, different first and second test coupon portions 202 are separated from different first and second panels 200 produced using different first and second land pad surface finishes (e.g., two of organic solderablilty preservative finish (OSP), solder on pad finish (SOP, such as a SAC305 alloy where SAC is tin/silver/copper (S(Sn) A(Ag) C(Cu))), NiPdAu finish, etc.). PCBs (e.g., 400 above) are individually attached to the first and second test coupon portions 202 according to the method 100 described above, and the PCB/test coupon portion pairs are each IST tested. In this example, the test results are evaluated (e.g., 114 in FIG. 1) to compare BGA joint performance with respect to the tested land pad surface finishes.

Certain implementations of the described method 100 expand the sole output of normal IST testing by providing enhanced quantification and identification of micro-via cycles to failure, together with board level reliability (BLR) evaluation and results obtained concurrently with micro-via integrity assessment. The use of IST testing of the test coupon portion or portions 202, 203 provides a more complete reliability evaluation of the BGA products manufactured (e.g., at 108) using the substrates 204 in a shorter time than was previously possible, since board level reliability testing of the BGA product typically takes upwards to four months to complete temperature cycling. For example, the board level reliability testing of actual produced BGA products can only be done at 109 in FIG. 1 (e.g., standard temperature cycling in reliability chambers using BGA products manufactured at 108). In contrast, the PCB attachment to the test coupon portion(s) 202, 203, the IST testing at 112, and the test result evaluation at 114 can occur directly after singulation off the production panel 200. Even where the IST testing is performed at a third party facility, the concepts of the present disclosure facilitate generation of reliability assessment data building on the IST IPC-TM-650 specification testing or other suitable interconnect stress testing techniques and equipment. The present disclosure facilitates generation of reliability assessment data within days rather than weeks or months as compared to standard quality in electronic manufacturing (QEM) qualification testing with the benefit to capture both micro-via integrity and BGA joint reliability simultaneously. Whereas current IST testing focuses at the bare substrate level and does not simulate significant stresses at micro-via interface when the PCB is attached, disclosed examples incorporate device to board coupling via a SMT process, which simulates customer applications. In addition, earlier test evaluations reduce development learning cycles and reduce time to market for flip chip BGA products. Furthermore, the concurrent testing capabilities of the described method 100 facilitate improved detection of micro-via reliability, because empirical evidence exists that micro-vias do not crack at similar VC ranges during coupon level reliability (CLR or IST) testing without a board attached in specific flip chip BGA applications.

The test coupon example 202, 203 in FIGS. 3-6 includes a rigid core material layer 600, with two or more dielectric layers laminated between copper layers above and below the rigid core material layer 600. The example test coupon 202, 203 also includes conductive micro-vias 610, 612, 614 and 616 that individually extend through one or more of the dielectric layers between two of the copper layers, and conductive land pads 401 on the side 411 of an outer one of the dielectric layers. The conductive land pads 401 individually contact one of the conductive micro-vias 612 to facilitate soldering to the PCB 400.

Described IST testing examples also provide advantages over electrical tests for detection of micro-via issues, which require cross-sectional analysis for confirmation. Other methods like isothermal solder fatigue testing can provide life cycle predictions for solder joints, along with the ability to characterize micro-via reliability. However, isothermal solder fatigue testing does not incorporate the full package material set (e.g., bill of material and build-up stack simulating a flip chip BGA substrate and manufacturing processes, but rather joint scale samples). Moreover, isothermal solder fatigue testing is largely static temperature based, and does not offer testing in-situ in dynamic temperature conditions. Described examples can be used in assessing reliability of a variety of products and package types destined for different end use applications. For example, the described method 100 better simulates automotive and other customer applications and package stresses with the production device mounted to a host PCB. The example method 100 also provides a more comprehensive assessment of micro-via integrity due to coupling from the PCB. The method 100 captures both micro-via integrity and BGA reliability in one test, and the results are available in days rather than several months as was the case using board level reliability (BLR) testing to assess BGA product reliability.

Figure 7:
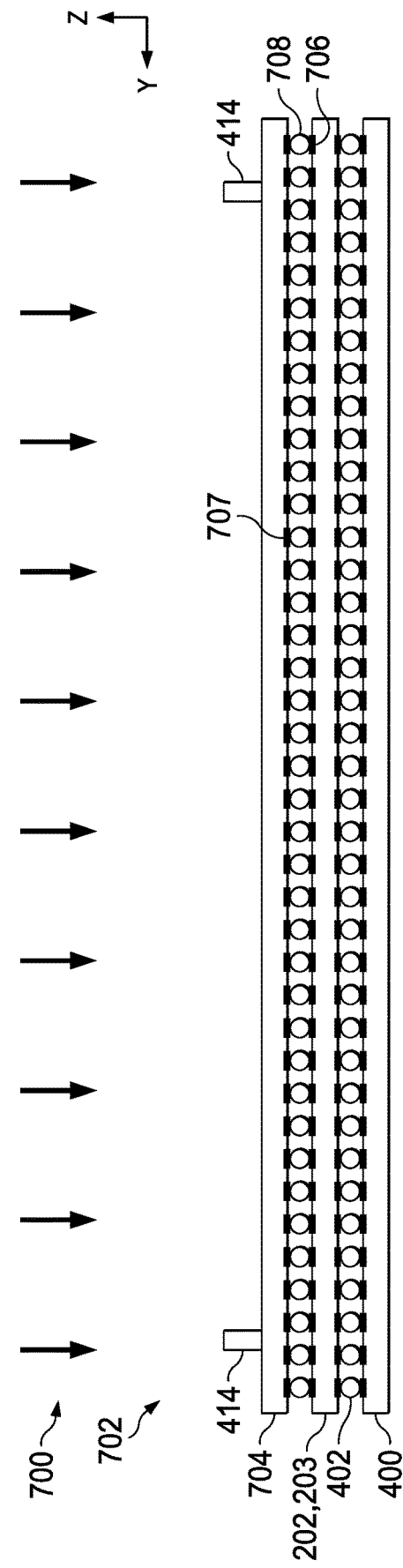
FIG. 7 is a side elevation view showing another example with first and second printed circuit boards attached to top and bottom sides of the test coupon portion.
Figure 8:
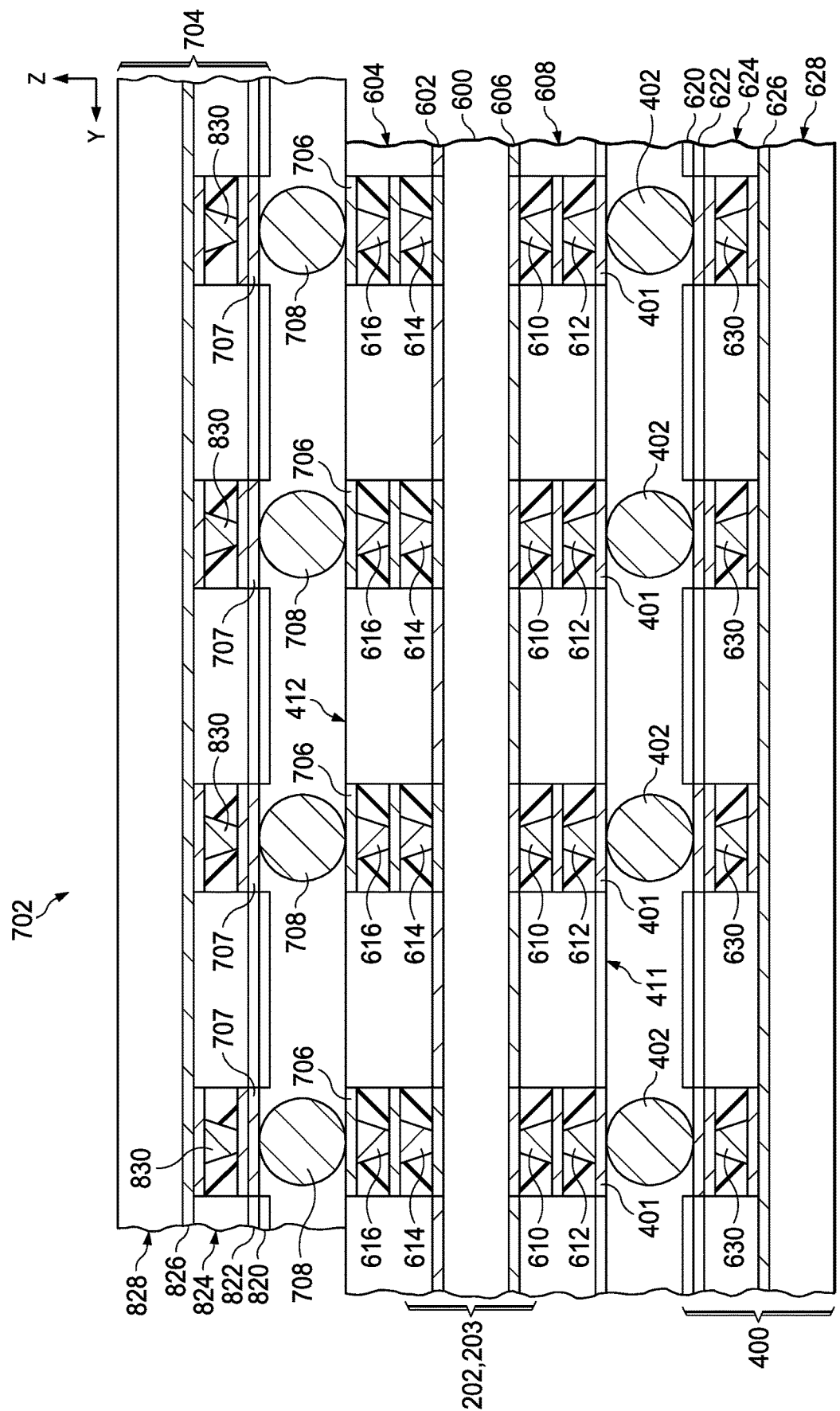
FIG. 8 is a partial sectional side view showing a portion of the test coupon portion and the attached printed circuit boards of FIG. 7.

Referring also to FIGS. 7 and 8, FIG. 7 shows another example assembly 702, in which a second SMT attachment process 700 is performed that attaches first and second printed circuit boards 400 and 704 respectively to the first and second (e.g., bottom and top) sides 411 and 412 of the test coupon portion 202, 203. FIG. 8 shows a portion of the test coupon portion 202, 203 and the attached printed circuit boards 400 and 704 of FIG. 7. The test coupon portion 202, 203 in this example includes conductive land pads 706 on the second side 412 and the second PCB 704 has corresponding conductive land pads 707. The process 700 mellows solder balls 708 to solder the corresponding pairs of land lads 706 and 707 together to attach the second PCB 704 to the second side 412 of the test coupon portion 202, 203 as shown in FIG. 8. In this example, the connectors 414 are mounted on the upper side of the second PCB 704 as shown in FIG. 7, although not a strict requirement of all possible implementations. This structure 702 facilitates concurrent IST testing of the upper outer micro-vias 616 when connected to the attached second PCB 704. The example second PCB 704 in FIG. 8 is a multi-layer structure, although single-layer PCBs can be used in other implementations. The PCB 704 includes a lower or bottom layer 820 (e.g., FR-4) disposed below a first conductive trace or feature layer 822. The example second PCB 704 also includes a middle layer 824 that extends between the conductive feature layer 822 and an upper conductive feature layer 826, and a top PCB layer 828 that covers the conductive layer 826 to form a top side of the PCB 704, The example second PCB 704 also includes conductive micro-vias 830 that connect the conductive features of the layers 822 and 826.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:
1. A method, comprising:
   manufacturing a production panel that includes:
      a test coupon portion with a plurality of land pads connected to outer layer micro-vias on a first side of the test coupon portion, and
      a plurality of package substrate portions;
   separating the test coupon portion and the plurality of package substrate portions from the production panel;
   attaching a printed circuit board to the test coupon portion using a surface mount process to solder at least some of the land pads of the test coupon portion to conductive features of the printed circuit board; and performing an interconnect stress test that passes current through the outer layer micro-vias of the test coupon portion.

2. The method of claim 1,
wherein the production panel includes a first test coupon portion, and a second test coupon portion;
wherein separating the test coupon portion from the production panel includes:
separating the first test coupon portion from the production panel, and
separating the second test coupon portion from the production panel;
wherein attaching a printed circuit board to the test coupon portion includes:
attaching a first printed circuit board to the first test coupon portion using a first surface mount process to solder land pads of the first test coupon portion to conductive features of the first printed circuit board, and
attaching a second printed circuit board to the second test coupon portion using a second surface mount process to solder land pads of the second test coupon portion to conductive features of the second printed circuit board.

3. The method of claim 2, wherein the first surface mount process uses a first ball solder metallurgy to solder the land pads of the first test coupon portion to the conductive features of the first printed circuit board; and wherein the second surface mount process uses a different second ball solder metallurgy to solder the land pads of the second test coupon portion to the conductive features of the second printed circuit board.

4. The method of claim 3, further comprising:
evaluating the first and second ball solder metallurgies according to results of the interconnect stress test.

5. The method of claim 2, further comprising:
manufacturing a plurality of ball grid array (BGA) products using the package substrate portions;
evaluating micro-via reliability of the BGA products according to results of the interconnect stress test.

6. The method of claim 2, further comprising:
manufacturing a plurality of ball grid array (BGA) products using the package substrate portions;
evaluating solder joint reliability of the BGA products according to results of the interconnect stress test.

7. The method of claim 1, further comprising:
manufacturing a plurality of ball grid array (BGA) products using the package substrate portions;
evaluating micro-via reliability of the BGA products according to results of the interconnect stress test.

8. The method of claim 7, further comprising:
evaluating solder joint reliability of the BGA products according to results of the interconnect stress test.

9. The method of claim 1, further comprising:
manufacturing a plurality of ball grid array (BGA) products using the package substrate portions;
evaluating solder joint reliability of the BGA products according to results of the interconnect stress test.

10. The method of claim 1, further comprising:
evaluating a ball solder metallurgy according to results of the interconnect stress test.

11. The method of claim 1, further comprising:
attaching a second printed circuit board to the test coupon portion using a second surface mount process to solder at least some further land pads of the test coupon portion to conductive features of the second printed circuit board; and performing the interconnect stress test that passes current through further outer layer micro-vias of the test coupon portion.

12. A method, comprising:
performing an interconnect stress test that passes current through outer layer micro-vias of a test coupon portion of a production panel that is soldered to a printed circuit board;
evaluating reliability of BGA products manufactured using package substrate portions of the production panel according to results of the interconnect stress test.

13. The method of claim 12, wherein evaluating the reliability of the BGA products comprises evaluating solder joint reliability of the BGA products according to the results of the interconnect stress test.

14. The method of claim 13, wherein evaluating the solder joint reliability of the BGA products comprises evaluating a ball solder metallurgy according to the results of the interconnect stress test.

15. The method of claim 13, wherein evaluating the reliability of the BGA products comprises evaluating micro-via reliability of the BGA products according to results of the interconnect stress test.

16. The method of claim 12, wherein evaluating the reliability of the BGA products comprises evaluating micro-via reliability of the BGA products according to results of the interconnect stress test.

17. The method of claim 12, further comprising:
soldering a second printed circuit board to the test coupon portion before performing the interconnect stress test.

18. A method, comprising:
separating a test coupon portion and a plurality of package substrate portions from a production panel, the test coupon portion including a plurality of land pads connected to outer layer micro-vias;
soldering the land pads of the test coupon portion to conductive features of a printed circuit board;
performing an interconnect stress test that passes current through the outer layer micro-vias of the test coupon portion; and
evaluating reliability of BGA products made from the package substrate portions according to results of the interconnect stress test.

19. The method of claim 18, wherein evaluating the reliability of the BGA products comprises evaluating solder joint reliability of the BGA products according to the results of the interconnect stress test.

20. The method of claim 19, wherein evaluating the evaluating the solder joint reliability of the BGA products comprises evaluating a ball solder metallurgy according to the results of the interconnect stress test.

21. The method of claim 19, wherein evaluating the reliability of the BGA products comprises evaluating micro-via reliability of the BGA products according to results of the interconnect stress test.

22. The method of claim 18, wherein evaluating the reliability of the BGA products comprises evaluating micro-via reliability of the BGA products according to results of the interconnect stress test.

23. The method of claim 18, further comprising:
soldering further land pads of the test coupon portion to conductive features of a second printed circuit board before performing the interconnect stress test.

* * * * *